(12) United States Patent
Paz (10) Patent No.: US 9,881,657 B2
(45) Date of Patent: Jan. 30, 2018

(54) COMPUTER SYSTEM AND METHOD OF MEMORY MANAGEMENT

(71) Applicant: Marvell World Trade Ltd., St. Michael (BB)

(72) Inventor: Nir Paz, Azur (IL)

(73) Assignee: MARVELL WORLD TRADE LTD., St. Michael (BB)

(*) Notice: Subject to any disclaimer, the term of this patent is extended or adjusted under 35 U.S.C. 154(b) by 98 days.

(21) Appl. No.: 13/888,456

(22) Filed: May 7, 2013

(65) Prior Publication Data

US 2013/0304981 A1 Nov. 14, 2013

Related U.S. Application Data

(60) Provisional application No. 61/717,884, filed on Oct. 24, 2012, provisional application No. 61/644,359, filed on May 8, 2012.

(51) Int. Cl.
*G06F 12/00* (2006.01)
*G11C 7/10* (2006.01)
*G06F 13/16* (2006.01)

(52) U.S. Cl.
CPC ........ *G11C 7/1072* (2013.01); *G06F 13/1694* (2013.01); *Y02B 60/1228* (2013.01)

(58) Field of Classification Search
CPC ... G11C 7/1072; G11C 7/1006; G06F 1/3203; G06F 1/3215; G06F 7/1072; G06F 7/1006

(Continued)

(56) References Cited

U.S. PATENT DOCUMENTS 6,378,018 B1 4/2002 Tsern et al.
7,243,254 B1 7/2007 Kuroodi et al.
(Continued)

FOREIGN PATENT DOCUMENTS

CN 1286442 3/2001
CN 101689145 3/2010
(Continued)

OTHER PUBLICATIONS

International Search Report and Written Opinion dated Oct. 16, 2013 issued in related/corresponding International Patent Application No. PCT/IB2013/001286 filed May 7, 2013.

(Continued)

*Primary Examiner* — Ryan Bertram
*Assistant Examiner* — Trang Ta (57) ABSTRACT

Computer systems and methods for memory management in a computer system are provided. A computer system includes an integrated circuit, where the integrated circuit includes a processing unit and a memory controller coupled to the processing unit. The memory controller includes a first interface and a second interface configured to couple the memory controller with a first memory and a second memory, respectively. The second interface is separate from the first interface. The computer system includes the first memory of a first memory type coupled to the memory controller through the first interface. The computer system further includes the second memory coupled to the memory controller through the second interface, where the second memory is of a second memory type that has a different power consumption characteristic than that of the first memory type.

18 Claims, 6 Drawing Sheets

(58) Field of Classification Search
USPC .......................................... 711/104, 105, 154
See application file for complete search history.

(56) References Cited

U.S. PATENT DOCUMENTS

| | | | |
|---|---|---|---|
| 8,139,435 | B2 | 3/2012 | Yamasaki |
| 8,930,647 | B1* | 1/2015 | Smith ................. G06F 9/44557 |
| | | | 711/103 |
| 2001/0054135 | A1* | 12/2001 | Matsuda ....................... 711/167 |
| 2003/0061432 | A1 | 3/2003 | Huppenthal et al. |
| 2003/0137881 | A1 | 7/2003 | Sasaki |
| 2004/0123036 | A1 | 6/2004 | Hammitt et al. |
| 2005/0198002 | A1* | 9/2005 | Ito ......................... G06F 11/167 |
| 2009/0292934 | A1* | 11/2009 | Esliger ................. G06F 1/3203 |
| | | | 713/323 |
| 2010/0058087 | A1* | 3/2010 | Borras .................. G06F 1/3203 |
| | | | 713/322 |
| 2010/0232247 | A1* | 9/2010 | Yamasaki ..................... 365/222 |
| 2010/0281309 | A1* | 11/2010 | Laurenti et al. ................ 714/45 |
| 2011/0283071 | A1* | 11/2011 | Yokoya et al. ............... 711/162 |
| 2012/0069034 | A1 | 3/2012 | Biswas et al. |
| 2012/0072677 | A1* | 3/2012 | Biswas et al. ................ 711/149 |
| 2012/0272036 | A1* | 10/2012 | Muralimanohar .. G06F 12/0238 |
| | | | 711/202 |
| 2013/0077393 | A1* | 3/2013 | Ferrario et al. ............... 365/163 |
| 2013/0080621 | A1* | 3/2013 | Jain ....................... G06F 9/5094 |
| | | | 709/224 |
| 2013/0138900 | A1* | 5/2013 | Ishihara .............. G06F 12/0638 |
| | | | 711/158 |

FOREIGN PATENT DOCUMENTS

| | | |
|---|---|---|
| CN | 102402490 | 4/2012 |
| JP | 2009163582 | 7/2009 |

OTHER PUBLICATIONS

Office Action dated Jun. 12, 2015 from related/corresponding Korean Patent Appl. No. 10-2014-7034343.
Office Action dated Jan. 29, 2016 issued in related/corresponding Korean Patent Appl. No. 10-2014-7034343, filed Dec. 5, 2014.
1st Office Action dated Jun. 1, 2016 in related/correpsonding Chinese Patent Appl. No. 201380024937.6, filed Nov. 7, 2014.
2nd Office Action dated Mar. 28, 2017 in related/corresponding Chinese Patent Appl. No. 201380024937.6, filed Nov. 7, 2014.
3rd Office Action dated Aug. 4, 2017 from related/corresponding Chinese Patent Appl. No. 201380024937.6, filed Nov. 7, 2014.

* cited by examiner

COMPUTER SYSTEM AND METHOD OF MEMORY MANAGEMENT

CROSS-REFERENCE TO RELATED APPLICATIONS

This application claims priority to U.S. Provisional Patent Application No. 61/644,359, filed May 8, 2012, entitled "COST/POWER SENSITIVE PLATFORMS HAVING MIXED TYPES OF DDR SDRAM," and to U.S. Provisional Patent Application No. 61/717,884, filed Oct. 24, 2012, entitled "COST/POWER SENSITIVE PLATFORMS HAVING MIXED TYPES OF DDR SDRAM," which are herein incorporated in their entireties.

FIELD

The technology described herein relates generally to a computer system and method of memory management and more particularly to a computer architecture using a combination of multiple, different memory types.

BACKGROUND

Synchronous dynamic random access memory (SDRAM) is dynamic random access memory (DRAM) that is synchronized with a system bus of a computer system. SDRAM utilizes a synchronous interface, which causes the SDRAM to wait for a clock signal before responding to control inputs, therefore synchronizing the SDRAM with the system bus of the computer system. A data storage area of an SDRAM module is divided into several banks, allowing the SDRAM module to process several memory access commands simultaneously, interleaved among the several banks. The use of the multiple banks allows SDRAM to have higher data access rates than asynchronous DRAM. There are several types (i.e., families) of SDRAM available in the market, including Low Power DDR (LPDDR) (i.e., Mobile DDR) and double data rate synchronous dynamic random access memory (DDR SDRAM). The different types of SDRAM differ from each other in certain respects (e.g., speed, power consumption, and price, among others).

The description above is presented as a general overview of related art in this field and should not be construed as an admission that any of the information it contains constitutes prior art against the present patent application.

SUMMARY

Examples of computer systems and methods for memory management in a computer system are provided. A computer system includes an integrated circuit, where the integrated circuit includes a processing unit and a memory controller coupled to the processing unit. The memory controller includes a first interface and a second interface configured to couple the memory controller with a first memory and a second memory, respectively. The second interface is separate from the first interface. The computer system includes the first memory of a first memory type coupled to the memory controller through the first interface. The computer system further includes the second memory coupled to the memory controller through the second interface, where the second memory is of a second memory type that has a different power consumption characteristic than that of the first memory type.

As another example, a method for memory management in a computer system includes determining a mode of operation of an operating system. If the mode of operation is a first mode, a first memory of a first memory type is turned off. The first memory is of a different memory type than a second memory, wherein the second memory is of a second memory type having a different power consumption characteristic than that of the first memory type. If the mode of operation is not the first mode, a determination is made as to whether to store data to the first memory or the second memory. The determination is based on a memory demand of a process being executed on the computer system, a type of the process, the type of the process indicating a type of data that is manipulated by the process or a type of data that is generated by the process, whether the data is to be retained upon completion of the process, or whether the data is to be retained during the first mode of the operating system.

DETAILED DESCRIPTION

Figure 1:
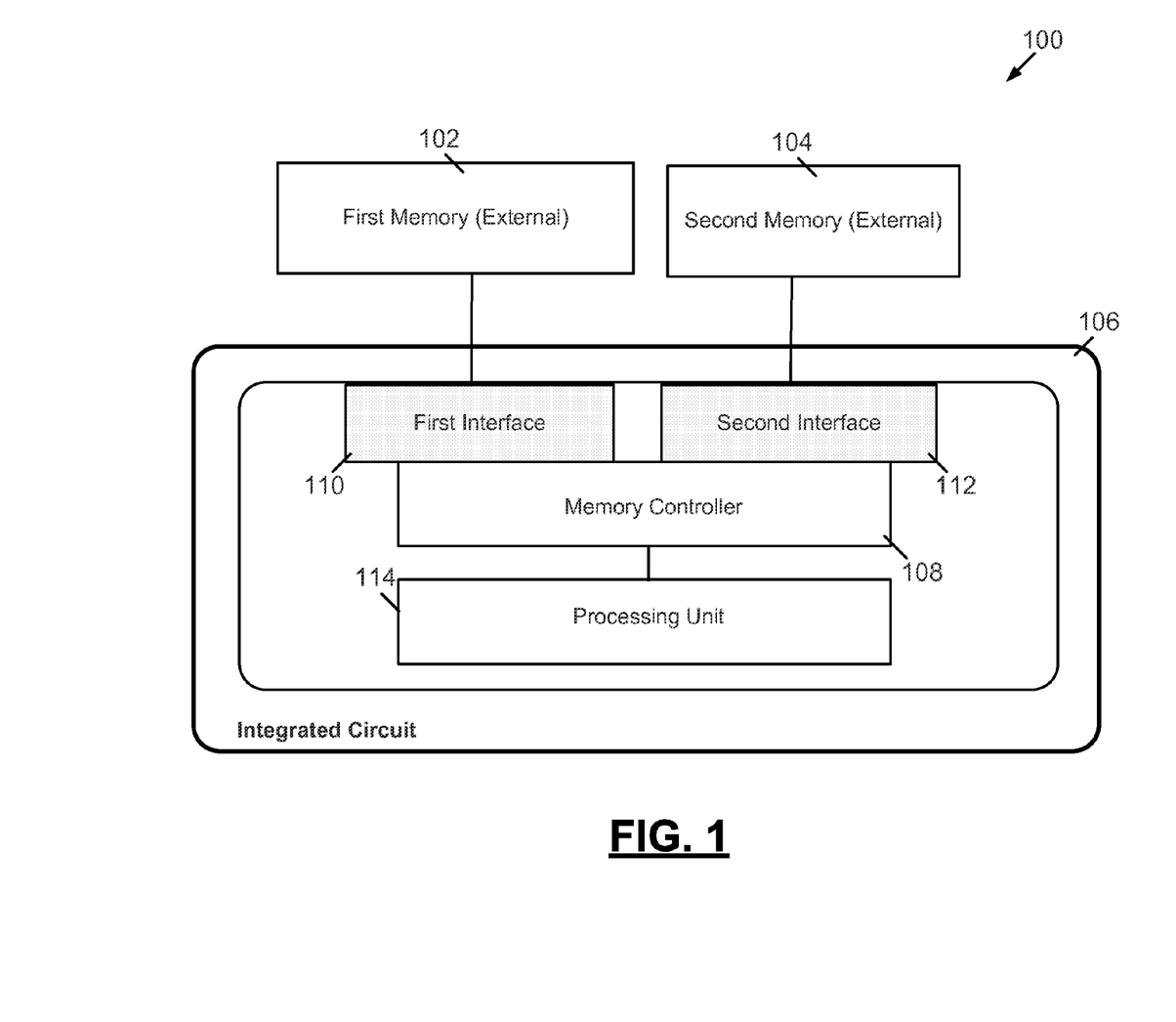
FIG. 1 depicts an example computer architecture including a first memory and a second memory coupled to an integrated circuit.

FIG. 1 depicts an example computer architecture 100 including a first memory 102 and a second memory 104 coupled to an integrated circuit 106. The first memory 102 and the second memory 104 are external to the integrated circuit 106 and are coupled to a memory controller 108 of the integrated circuit 106 via a first interface 110 and a second interface 112, respectively. The first interface 110 and the second interface 112 are separate from each other and, in an embodiment, are either separate from the memory controller 108 or physically integrated into the memory controller 108 for example. The first memory 102 includes, for example, one or more DDR2, DDR3, DDR3L, DDR3U, or DDR4 SDRAM devices, and the second memory 104 includes, for example, one or more LPDDR2, LPDDR3, LPDDR4, Mobile DDR, or WideI/O SDRAM devices. The integrated circuit 106 also includes a processing unit 114. The processing unit 114 is a general purpose processor, in an embodiment, that is capable of processing tasks driven by internal or external interrupts. The processing unit 114 is connected to various input devices and output devices (e.g., keyboard, touchpad, display device, speakers, etc.) in an embodiment of the integrated circuit 106.

Although the example computer architecture 100 depicts the integrated circuit 106 as including a single processing unit 114, in other examples, a plurality of processing cores are used to carry out instructions of computer programs. Further, although the example computer architecture 100 depicts the single memory controller 108 being coupled to the first memory 102 and to the second memory 104, in other embodiments, each of the memories 102, 104 is coupled to a separate memory controller. The integrated circuit 106 is, in an embodiment, a system on a chip (i.e., SoC) that integrates the processing unit 114, memory controller 108, interfaces 110, 112, and various other components into a single chip. In an embodiment, the integrated circuit 106 is part of a battery-consuming mobile device (e.g., a handheld computing device, smartphone, cellular telephone, personal data assistant, tablet computer, or laptop computer, among others) or any other type of computer system (e.g., desktop computer, server, etc.).

In the example computer architecture 100 of FIG. 1, the processing unit 114 is coupled to the first memory 102 and the second memory 104 via the memory controller 108 and the interfaces 110, 112, respectively. When the processing unit 114 needs to access the first memory 102 or the second memory 104, a read request or a write request is sent from the processing unit 114 to the memory controller 108, and the memory controller 108 in turn sends a corresponding read request or a write request to the first memory 102 or the second memory 104. Consequently, data from the processing unit 114 is written to the first memory 102 or the second memory 104, or data is read from the first memory 102 or the second memory 104 to the processing unit 114.

In the example computer architecture 100 of FIG. 1, the first memory 102 and the second memory 104 are of two different memory types (i.e., families), where the different memory types have characteristics that vary in certain respects. For example, in an embodiment, the second memory 104 consumes a lower amount of power when operating in a standby mode, as compared to the first memory 102. The standby mode is a low power mode used for holding (i.e., retaining) data values, and data is not read from memory or written to memory during this mode. In an embodiment, the first memory 102 and the second memory 104 consume a similar amount of power during an active, normal use mode, and similarly, in an embodiment, the memories 102, 104 consume a similar amount of power during a heavy use, multimedia mode. During the active, normal use mode and the heavy use, multimedia mode, data is read from memory, written to memory, and held in memory. The first memory 102 and the second memory 104 also differ in cost in an embodiment, with the first memory 102 having a lower cost as versus the second memory 104. By utilizing the combination of the first memory 102 and the second memory 104, with their varying power consumption and cost characteristics, in an embodiment, the example computer architecture 100 of FIG. 1 is optimized for both power consumption and cost at the same time. Power consumption and cost are further optimized in an embodiment by utilizing the varying power consumption characteristics of the different memories by selectively storing and accessing data at one type of memory or the other according to an expected need to use the data. The selective storing and accessing of the data is controlled by an operating system (OS) or application in an embodiment.

Specifically, in one example, the cost and power consumption characteristics of the computer architecture 100 are simultaneously optimized by dynamically turning the first memory 102 on and off according to certain criteria. In the example, the higher-cost, lower-power-consuming second memory 104 is turned on and operative at substantially all times (i.e., the second memory 104 is turned on and operative during each of the standby mode, the normal use mode, and the heavy use, multimedia mode). Cost is further reduced in an embodiment by making the more expensive second memory 104 relatively small and reserved for use only with data that needs to remain available for access even when the SoC is in a low power state, for example. Conversely, the lower-cost, higher-power-consuming first memory 102 is turned on and operative only at select periods of time and is otherwise turned off. Selectively turning the first memory 102 on and off in this manner is performed in order to cause the integrated circuit 106 to consume less power during the standby mode, while simultaneously allowing the integrated circuit 106 to extend its memory for the heavy use, multimedia mode in a cost-efficient manner. The first memory 102 is turned off by not supplying power to the first memory 102, thus eliminating or lowering a self-refresh current and a leakage current of the first memory 102.

The determinations of a) whether the first memory 102 is turned off or turned on, and b) whether data is to be stored in the first memory 102 or the second memory 104 are made based on one or more criteria. The criteria include, but are not limited to, a mode of operation of an OS being executed on the processing unit 114, a type of a process being executed on the processing unit 114, a memory demand of the process, and whether the data is to be retained upon completion of the process. In an example, if the OS enters a standby mode of operation (i.e., a low power mode for retaining data values in the memories 102, 104 and prohibiting read and write operations to the memories 102, 104), the first memory 102 is turned off. In the standby mode, the memory demands of the integrated circuit 106 are low to medium. The first memory 102 is turned off during the standby mode of the OS because the first memory 102 consumes a higher amount of power when operating in the standby mode, as compared to the second memory 104. Thus, in an embodiment, when the OS is in the standby mode, it is configured to turn off the power supplied to the first memory 102 and cause the second memory 104 to perform all necessary data retention operations. Thus, by turning off the power supply to the high power first memory, energy consumption is reduced. At the same time because only that portion of the data which should not be lost is retained using the low power memory 104, the size of the relatively expensive second memory 104 is reduced.

In another example, the process being executed on the processing unit 114 is a multimedia computer program (e.g., an interactive video game program, a video recording program, etc.), where the memory demand of the multimedia computer program is high. The memory demand is high in an embodiment due to the fact that the multimedia computer program requires storage of large amounts of data or because the multimedia computer program requires a high data throughput (i.e., a high rate at which the data is read from or stored into the memories 102, 104). To accommodate the high memory demand of the multimedia computer program, when the multimedia computer program is operational, the first memory 102 is turned on, thus extending the memory available in the computer architecture 100. As described above, the second memory 104 is configured to be operative at substantially all times, including the heavy use, multimedia mode. Turning on the first memory 102 extends the memory available above that of the second memory 104, such that data associated with the multimedia computer program is stored in the first memory 102. At the completion of the multimedia computer program, power supply to the first memory 102 is cut off, such that the first memory 102 is not left on during a subsequent standby mode or normal use mode, thereby essentially eliminating inadvertent power consumption, for example, because of leakage.

In another example, the determination as to whether the data is to be stored in the first memory 102 or the second memory 104 is made based on whether the data is to be retained upon completion of the process. The data is, for example, data that is associated with the process (i.e., data manipulated by the process or data generated by the process). If the data associated with the process is not required to be retained upon completion of the process, the process or the data associated with the process is stored in the first memory 102. If the data associated with the process must be retained upon completion of the process, the process or the data associated with the process is not loaded into the first memory 102 and is instead stored in the second memory 104. By not storing the data in the first memory 102 when the data must be retained upon completion of the process, the first memory 102 is turned off during the standby, data retention mode, as described above, without losing any data values. Because the first memory 104 consumes a higher amount of power when operating in the standby, data retention mode, turning off the first memory 102 in this mode allows for lower power consumption in the example computer architecture 100.

The above-described bases for turning the first memory 102 on and off and for determining whether to store data to the first memory 102 or the second memory 104 are examples, and various other factors are used in managing the memories 102, 104 in other embodiments (e.g., factors based on data access rate, memory size, etc.). Further, although the example computer architecture 100 of FIG. 1 depicts two memories 102, 104 and two interfaces 110, 112, in other embodiments, a larger number of different type memories and corresponding interfaces are used. As described above, using the two memories 102, 104 and the two interfaces 110, 112 allows the example computer architecture 100 to optimize cost and power consumption variables simultaneously. By replacing the memories 102, 104 with other memories having other characteristics or by adding additional memories that differ from the memories 102, 104 in certain respects, in other embodiments, the example computer architecture 100 is optimized for other variables or additional variables. For example, in an embodiment, the example computer architecture 100 is optimized for speed or data access rate variables in addition to the cost and power variables optimized in the example of FIG. 1.

Figure 2:
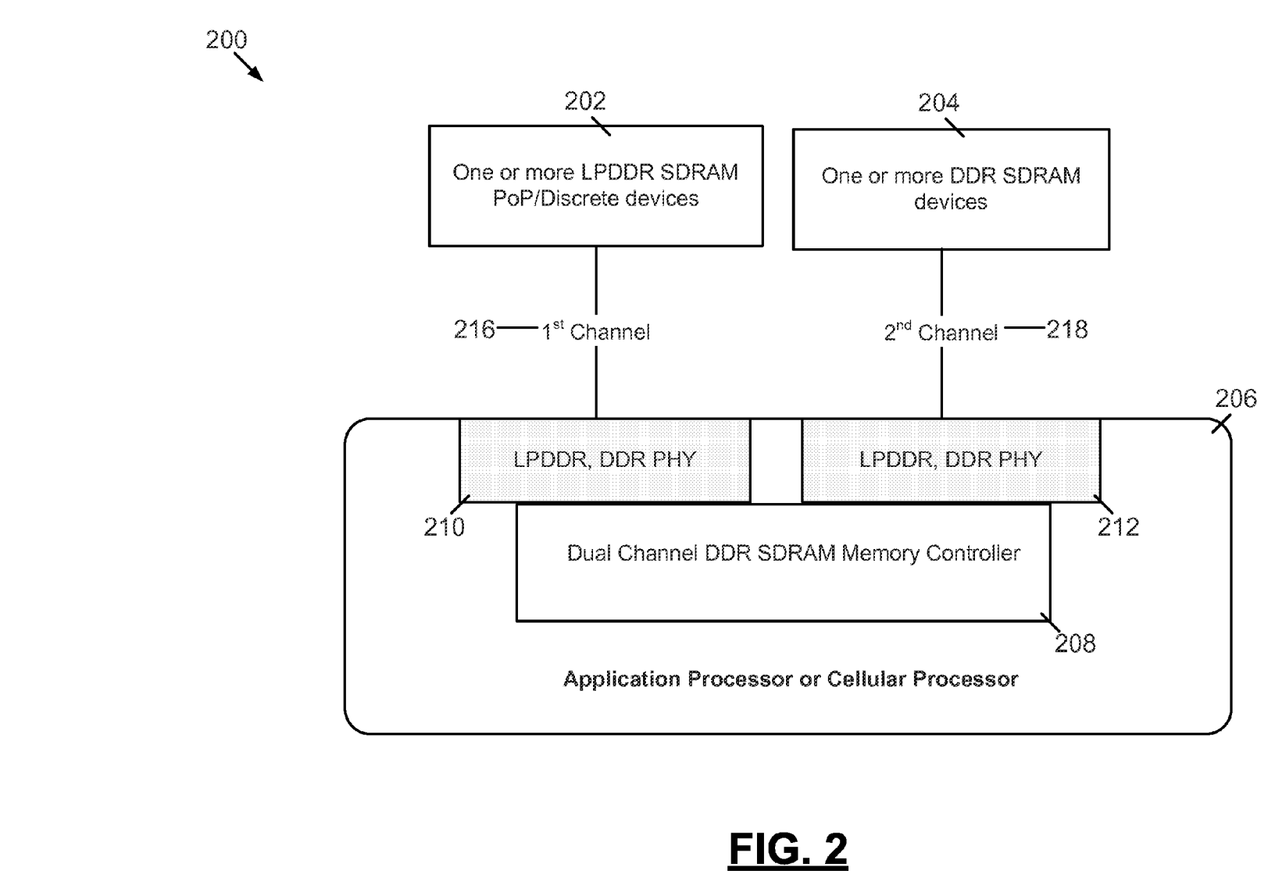
FIG. 2 depicts another example computer architecture including one or more Low Power DDR synchronous dynamic random access memory package on package/discrete devices and one or more double data rate synchronous dynamic random access memory devices coupled to an application processor or a cellular processor.

FIG. 2 depicts another example computer architecture 200 including one or more Low Power DDR synchronous dynamic random access memory package on package (PoP)/discrete devices 202 and one or more double data rate synchronous dynamic random access memory devices 204 coupled to an application processor or a cellular processor 206. The one or more Low Power DDR synchronous dynamic random access memory PoP/discrete devices (hereinafter "LPDDR memory") 202 include one or more LPDDR2, LPDDR3, LPDDR4, Mobile DDR, or Wide I/O memories in an embodiment. The one or more double data rate synchronous dynamic random access memory devices (hereinafter "DDR memory") 204 include one or more DDR2, DDR3, DDR3L, DDR3U, or DDR4 memories in an embodiment. The LPDDR memory 202 and the DDR memory 204 are external to the application processor or the cellular processor 206 and are coupled to a dual channel DDR SDRAM memory controller 208 of the application processor or the cellular processor 206 via a first LPDDR, DDR PHY interface (i.e., physical interface) 210 and a second LPDDR, DDR PHY interface 212, respectively. The first and second interfaces 210, 212 are separate from each other. In an embodiment, the first and second interfaces 210, 212 are integrated within the memory controller 208, or the first and second interfaces 210, 212 are physically separated from the memory controller 208 and coupled to the memory controller 208 via a suitable connection.

The application processor or the cellular processor 206 is used in a handheld device platform, such as a smartphone, laptop, tablet computer, or any other type of computer system (i.e., a desktop computer or server) in an embodiment. The application processor or the cellular processor 206 is configured to execute instructions to support an OS of the handheld device, networking and wireless transmission protocols of the handheld device, and any number of other applications of the handheld device (e.g., gaming, video recording, music playback, web browsing, email, etc.). The dual channel DDR SDRAM memory controller 208 of the processor 206 is configured to simultaneously support a plurality of different DDR SDRAM types (i.e., families), including the LPDDR memory type and the DDR memory type depicted in FIG. 2. The dual channel nature of the memory controller 208 means, among other things, that each of a first channel 216 and a second channel 218 has its own PHY physical interface (i.e., PHY interfaces 210, 212, respectively, in FIG. 2). The dual channel memory controller 208 permits the mixture of the LPDDR memory 202 and the DDR memory 204, where the LPDDR memory 202 interfaces with the processor 206 over the first channel 216, and the DDR memory 204 interfaces with the processor 206 over the second channel 218. The LPDDR memory 202 and the DDR memory 204 are operated at a same frequency or a similar frequency in an embodiment.

The LPDDR memory 202 and the DDR memory 204 differ from each other in terms of a) cost and b) power consumption in a standby mode. In an embodiment, the standby mode is a low power mode for retaining data values, where read and write operations with the memories 202, 204 are not be permitted. The combination of the LPDDR memory 202 and the DDR memory 204 allows the computer architecture 200 to be optimized for both cost and power consumption at the same time. The LPDDR memory 202 has a lower power consumption in the standby mode, as compared to the DDR memory 204. For example, the power consumption of the LPDDR memory 202 in the standby mode is of an order of three times better than the DDR memory 204. As an example, Micron MT41K128M16 DDR3L, 533 MHz-993 MHz, 2 Gb has a self-refresh current (IDD6) of 12 mA at 1.35 V, causing a power consumption of 16.2 mW in the low power, standby mode, and Micron MT41J128M16 DDR3 533 MHz-1066 MHz, 2 Gb has a self-refresh current (IDD6) of 12 mA at 1.5 V, causing a power consumption of 18 mW in the low power standby mode. By contrast, for example, Micron MT42L128M16 LPDDR2, 533 MHz, 2 Gb has a self-refresh current (IDD6) of 1.2 mA at 1.8 V plus 2.5 mA at 1.2 V, causing a power consumption of 5.16 mW in the low power, standby mode. In an embodiment, in an active power mode (i.e., a mode for reading, writing, and holding data in the memories 202, 204), there is little difference in power consumption between the LPDDR memory 202 and the DDR memory 204, and in an embodiment, a performance of the LPDDR memory 202 and the DDR memory 204 is similar. In an embodiment, the LPDDR memory 202 is more expensive than the DDR memory 204 (e.g., on the order of 1.7 to 2.0 times more expensive).

In the example computer architecture 200 of FIG. 2, the LPDDR memory 202 functions as a persistent memory that is configured to be turned on and operative at substantially all times (e.g., the LPDDR memory 202 operates during each of the standby mode, a normal use mode, and a heavy, multimedia use mode). In an embodiment, the LPDDR memory 202 needs only to be sufficiently large to store an anticipated amount of data that should be retained when the architecture 200 enters a low power (i.e., standby) state, plus some additional space as a security measure. Other memory in the example computer architecture 200 is conventional DDR DRAM memory (e.g., the DDR memory 204). The DDR memory 204 is generally used only to extend the available memory during the heavy, multimedia use mode (e.g., when memory demands on the processor 206 are high, with the high memory demands requiring storage of large amounts of data or a high throughput of data). The DDR memory 204 is thus turned on or turned off based on the memory demand on the processor 206 or based on a memory demand of a process being executed on the processor 206. Further, as described below, the DDR memory 204 is used for data storage based on a determination of whether the data to be stored is required to be retained in a memory upon completion of the process. If the data does not need to be retained upon completion of the process, the DDR memory 204 is used to store the data.

In the example computer architecture 200 of FIG. 2 with the mixture of the LPDDR memory 202 and the DDR memory 204, a basic memory that is used for normal use and low power, standby use cases consists only of the LPDDR memory 202. The basic memory is, in an embodiment, 1 Gb out of a total of a 4 Gb address map that the application processor or the cellular processor 206 is able to access. The DDR memory 204 is turned off for the normal use and the low power, standby use cases. The LPDDR memory 202 that is turned on during the low power, standby use case is in a Self-Refresh mode in an embodiment. The available memory in the example computer architecture 200 of FIG. 2 is extended in a heavy multimedia use case by dynamically adding (i.e., turning on) the DDR memory 204. During the heavy multimedia use case, the LPDDR memory 202 remains turned on and is used to store data. With the DDR memory 204 turned on, for example, the available memory is increased to 2 Gb out of the total of the 4 Gb address map that the application processor or the cellular processor 206 accesses. Characteristics of the heavy multimedia use case, the normal use case, and the standby use case are described in greater detail below with respect to FIG. 3.

The determination of whether to store data in the DDR memory 204 or the LPDDR memory 202 is made based on a mode of operation of a process being executed on the processor 206 (i.e., whether the process is operating in the heavy use, multimedia mode) or based on a memory demand of the process (i.e., whether the memory demand is high, low, or medium). The determination as to whether data is to be stored in the DDR memory 204 or the LPDDR memory 202 is also made based on whether the data is to be retained upon completion of the process, in an embodiment. The data includes, for example, data associated with the process (e.g., data manipulated by the process or data generated by the process). If the data associated with the process is not required to be retained upon the completion of the process, the process or the data associated with the process is stored in the DDR memory 204. If the data associated with the process must be retained upon completion of the process, the data associated with the process is not stored in the DDR memory 204, and the data is instead stored in the LPDDR memory 202. By not storing the data in the DDR memory 204 when the data must be retained upon completion of the process, the DDR memory 204 is turned off during the standby, data retention mode, in an embodiment, thus lowering a power consumption of the example computer architecture 200. As noted above, the DDR memory 204 consumes a greater amount of power in the standby, data retention mode, as compared to the LPDDR memory 202.

By using the combination of the LPDDR memory 202 and the DDR memory 204 in the manner described above, a bill of materials (i.e., BOM) for the example computer architecture 200 is reduced in an embodiment. As described above, the less expensive DDR memory 204 is used to extend the memory in situations where the memory demand is high or where data need not be retained upon completion of a process. Because the DDR memory 204 is turned off during the low power, standby mode and only the LPDDR memory 202 is used to store data that needs to be retained in the low power, standby mode. As a result, in an embodiment, because the non-low-power memories are essentially switched off entirely in the low power mode, not only is a lower cost memory used, but in addition, the standby current and power consumption of the architecture 200 is minimized. The method of memory management described takes advantage of the low current of the LPDDR memory 202 while in the Self-Refresh mode, for example.

The LPDDR memory 202 (i.e., including the one or more LPDDR2, LPDDR3, LPDDR4, Mobile DDR, or WideI/O SDRAM devices) and the DDR memory 204 (i.e., including the one or more DDR2, DDR3, DDR3L, DDR3U, or DDR4 SDRAM devices) used in the computer architecture 200 are examples only. The methods of memory management described above with respect to FIG. 2 apply to all systems including two or more types of off-chip volatile memory (e.g., including memories and SoC that are available as Package on Package, System in Package, Multi-chip Module, and Through-silicon Via configurations and also as two or more discrete parts) where one type of volatile memory is more expensive and more power hungry during a standby mode and the other type is less expensive but has a higher standby current. In other embodiments, a computer architecture and method of memory management similar to that described above with respect to FIG. 2 is implemented using memory that is inside a package, memory that is in a Package on Package configuration, memory that is in a Through-silicon Via configuration, or one or more discrete memories. Additionally, the dual channel memory controller 208 is an example, and in other embodiments, a multi-channel memory controller including more than two channels (i.e., including more than two physical interfaces) is used. In another embodiment, the dual channel memory controller 208 is not used, and instead, two or more separate memory controllers are used, with each of the separate memory controllers being a single channel or a multiple channel memory controller.

Figure 3:
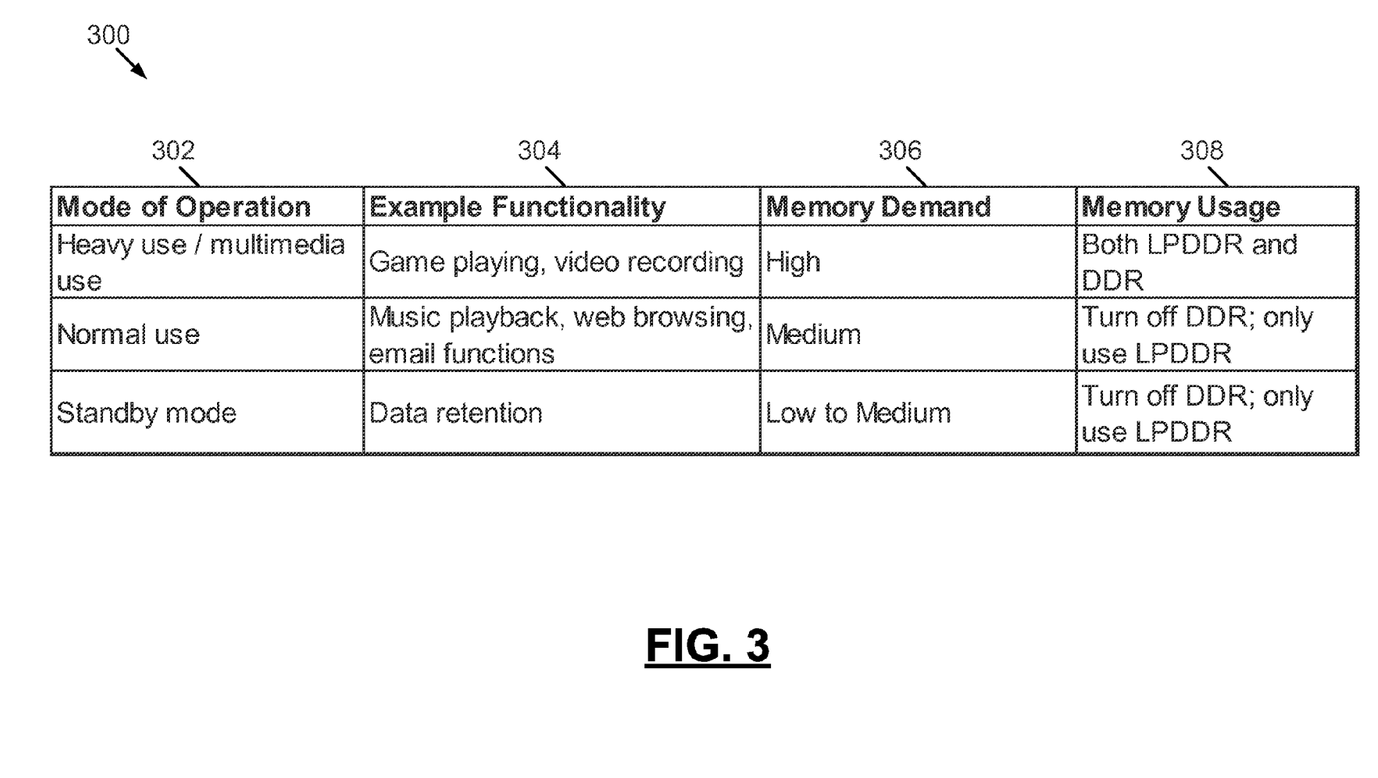
FIG. 3 depicts a table including information on example use cases of an application processor or a cellular processor and DDR SDRAM used in a handheld device.

FIG. 3 depicts a table 300 including information on example use cases of an application processor or a cellular processor and DDR SDRAM used in a handheld device. Columns included in the table 300 include mode of operation 302, example functionality 304, memory demand 306, and memory usage 308. The mode of operation column 302 describes a mode of operation supported by the application processor or the cellular processor and the DDR SDRAM. The mode of operation is dictated by an Operating System (OS) or one or more processes being executed on the application processor or the cellular processor in an embodiment. For example, the OS causes the application processor or the cellular processor and the DDR SDRAM to enter a standby, low power (i.e., data retention) mode in an embodiment. Conversely, for example, a particular process (e.g., a computer program) with instructions to cause video to be recorded on the handheld device causes the application processor or the cellular processor and the DDR SDRAM to be operating in a heavy use, multimedia mode of operation, in an embodiment.

As depicted in the table 300, for the heavy use/multimedia use mode of operation, example functionality includes interactive gaming applications and video recording applications, among others. The memory demand in the heavy use/multimedia use mode of operation is high, and an active power of the application processor or the cellular processor and the DDR SDRAM plays a significant role in the overall power consumption of the handheld device. With reference to FIG. 2, an example computer architecture 200 includes the LPDDR memory 202 and the DDR memory 204. During the heavy use/multimedia use mode of operation, both the LPDDR memory 202 and the DDR memory 204 are turned on and used to store data. From a perspective of software being executed on the application processor or the cellular processor, an available physical memory of the computer system architecture is at its greatest during the heavy use/multimedia use mode because the available memory includes all of the DDR SDRAM memories available (e.g., both of the LPDDR memory 202 and the DDR memory 204). Active power consumption and performance of the LPDDR memory 202 and the DDR memory 204, when running at a same frequency, are similar in an embodiment. Due to the similarities in active power consumption and performance in the embodiment, it is transparent to the software that some of the memory buffers are allocated to the LPDDR memory 202 and that some of the memory buffers are allocated to the DDR memory 204.

As illustrated in the table 300, for the normal use mode of operation, example functionality includes music playback, web browsing, and email functions, among others. The memory demand in the normal use mode of operation is medium, and an active power of the application processor or the cellular processor and the DDR SDRAM plays a significant role in the overall power consumption of the handheld device. With reference to FIG. 2, in an embodiment, during the normal use mode of operation, software decides to minimize its memory usage to a basic memory and reduce power by turning off the DDR memory 204, such that the LPDDR memory 202 is the only memory used during the normal use mode. Although the table 300 of FIG. 3 indicates that the DDR memory 204 is turned off during the normal use mode of operation, in other examples, the DDR memory 204 is allowed to remain turned on and is used to store data during the normal use mode of operation.

In the standby mode of operation, example functionality includes data retention (i.e., during the standby mode, data values are simply held in memory, and data values are not written to or read from the memory). The memory demand in the standby mode of operation is low to medium, and power consumption of the handheld device is dictated by the standby current of the application processor or the cellular processor and the DDR SDRAM. In the standby mode of operation, the DDR memory 204 is turned off, and only the LPDDR memory 202 is turned on. Contents of the LPDDR memory 202 need to be retained, and therefore the LPDDR memory 202 enters a Self-Refresh state, and the DDR memory 204, if not already turned off, is caused to turn off (i.e., there is no data retention for data stored in the DDR memory 204). Because the DDR memory 204 is turned off in the standby mode of operation, determinations of whether to store data to the DDR memory 204 are made based on whether the data needs to be retained upon completion of a process in an embodiment. This is described above, with reference to FIG. 2.

Figure 4:
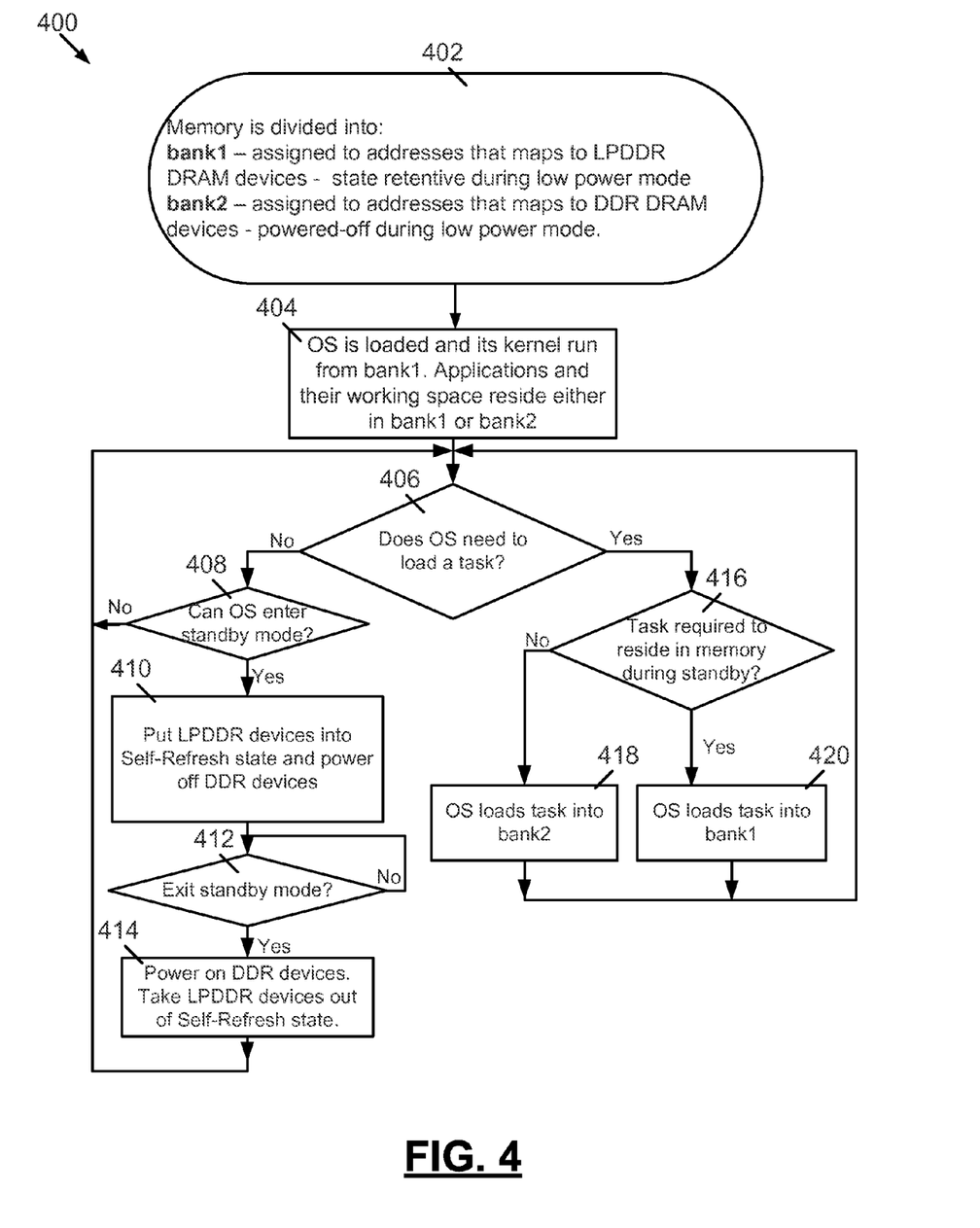
FIG. 4 is a flow diagram depicting example logic of a software management method for a computer architecture including a plurality of different types of DDR SDRAM.

FIG. 4 is a flow diagram 400 depicting example logic of a software management method for a computer architecture including a plurality of different types of DDR SDRAM. As described above with respect to FIG. 2, in the computer architecture 200 including the LPDDR memory 202 and the DDR memory 204, the DDR memory 204 is managed (i.e., turned on or turned off and used to store data or not) based on a memory demand of a process being executed on the processing unit, a mode of operation of an OS executing on the processor 206, or a data retention requirement of the process. The example logic of the flow diagram 400 of FIG. 4 illustrates an example method by which these variables are evaluated and used in managing the DDR memory 204. At 402, available memory of the computer architecture is divided into a bank1 and a bank2. The available memory includes LPDDR DRAM devices and DDR DRAM devices. The bank1 is assigned to addresses that map to the LPDDR DRAM devices, which are state retentive during a low power mode. The bank2 is assigned to addresses that map to the DDR DRAM devices, which are powered off during the low power mode.

At 404, an OS is loaded, and an OS kernel is executed from the bank1. Applications and working space for the applications reside in either the bank1 or the bank2. At 406, a determination is made as to whether the OS needs to load a task. At 406, a determination is also made as to whether a running application or task is requesting that the OS allocate memory. If no task is to be loaded and the running application or task is not requesting that the OS allocate memory, at 408, a determination is made as to whether the OS can enter a standby mode. If the OS cannot enter the standby mode, the determination at 406 is made again. If the OS can enter into the standby mode, at 410, the LPDDR devices are put into a Self-Refresh state, and the DDR devices are powered off. By this time, all applications and tasks that are not required during the standby mode are terminated, and the memory assigned to these applications and tasks becomes free. At 412, a determination is made as to whether the OS can exit the standby mode. The determination at 412 is repeated throughout the duration of the standby mode until the OS can exit the standby mode. When the OS can exit the standby mode, at 414, the DDR devices are powered on and re-initialized, and the LPDDR devices are taken out of the Self-Refresh state. Upon powering on the DDR devices and taking the LPDDR devices out of the Self-Refresh state, the determination at 406 is made again.

If it is determined that the OS needs to load a task, or it is determined that a running application or task is requesting that the OS allocate memory, at 416, a determination is made as to whether the task or application is of a type that is required to reside in memory during the standby mode. If the task is not required to reside in memory during the standby mode, at 418, the OS loads the task into the bank2 or assigns the application or task a buffer from the bank2. If the task is required to reside in the memory during the standby mode, at 420, the OS loads the task into the bank1 or assigns the application or task a buffer from the bank1. The loading of the task into either of the bank1 or the bank2 based on the determination at 416 reflects the fact that the LPDDR DRAM devices consume a lower amount of power when performing data retention in the standby mode, as compared to the DDR DRAM devices. Because of this fact, the DDR DRAM devices are used only for storing data associated with tasks that are not required to reside in memory during the standby mode, in an embodiment. After the task is loaded into one of the bank1 or the bank2 or the task or application is assigned the buffer from the bank1 or the bank2, the determination of whether the OS needs to load a task at 406 is made again.

Figure 5:
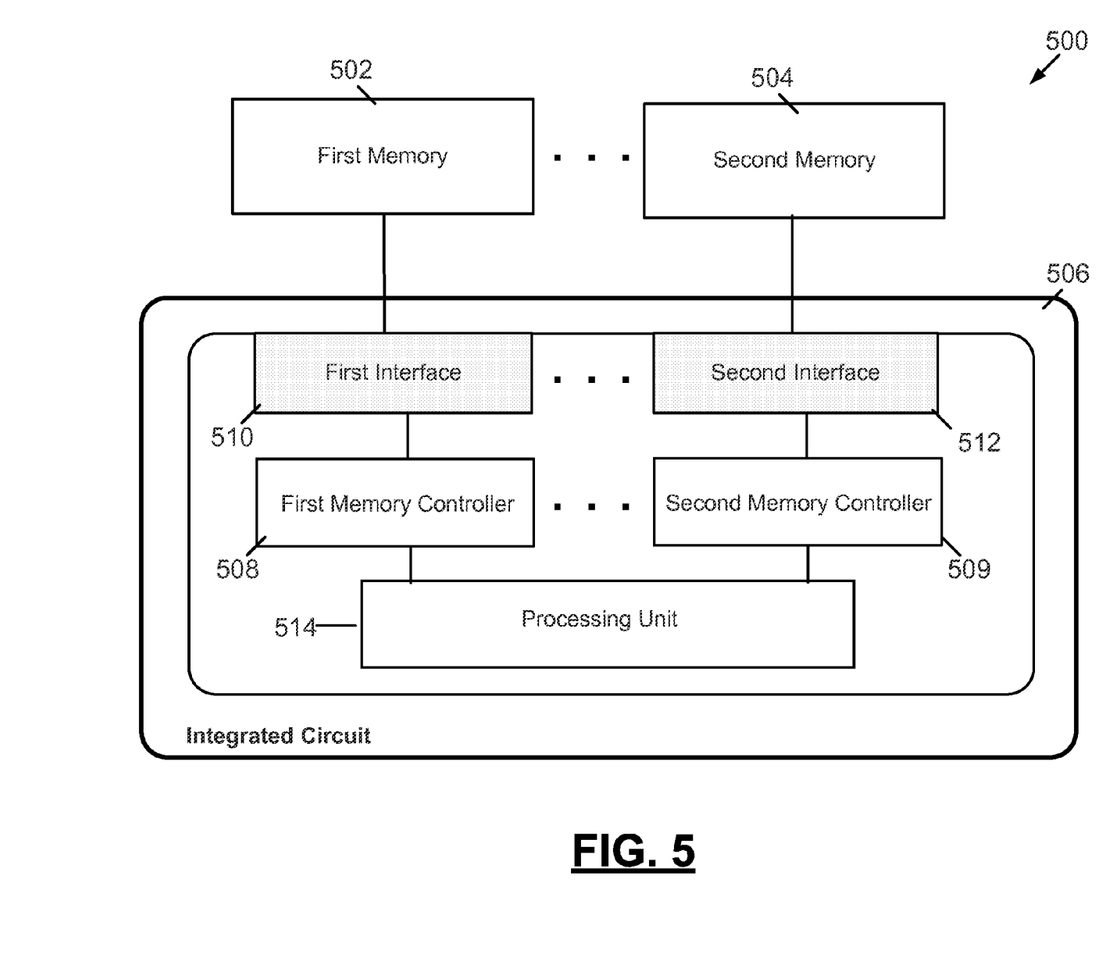
FIG. 5 depicts an example computer architecture including a first memory controller and a second memory controller coupled to a first memory and a second memory, respectively.

FIG. 5 depicts an example computer architecture 500 including a first memory controller 508 and a second memory controller 509 coupled to a first memory 502 and a second memory 504, respectively. In FIG. 5, the first memory controller 508 and the second memory controller 509 are part of an integrated circuit 506 and are both coupled to a processing unit 514 of the integrated circuit 506. First and second interfaces 510, 512 are used in coupling the first and second memory controllers 508, 509 with the first and second memories 502, 504, respectively. Although two memories 502, 504, two interfaces 510, 512, and two memory controllers 508, 509 are depicted in FIG. 5, in other examples, more than two of each of these components are used (e.g., as indicated by the dots in FIG. 5 between the memories, interfaces, and memory controllers). The memories 502, 504 are of two different memory types, where the two different memory types have different power consumption characteristics.

The memories 502, 504 are managed according to the methods described above with respect to FIGS. 1-4. The example computer architecture 500 of FIG. 5 differs from those described above due to the fact that two separate memory controllers 508, 509 are used in the example of FIG. 5, whereas previous figures utilized a single dual channel memory controller (e.g., dual channel memory controllers 108, 208 of FIGS. 1 and 2, respectively). The use of the separate memory controllers 508, 509 allows single channel memory controllers to be used in implementing computer architectures and methods of memory management similar to those described for FIGS. 1-4.

Figure 6:
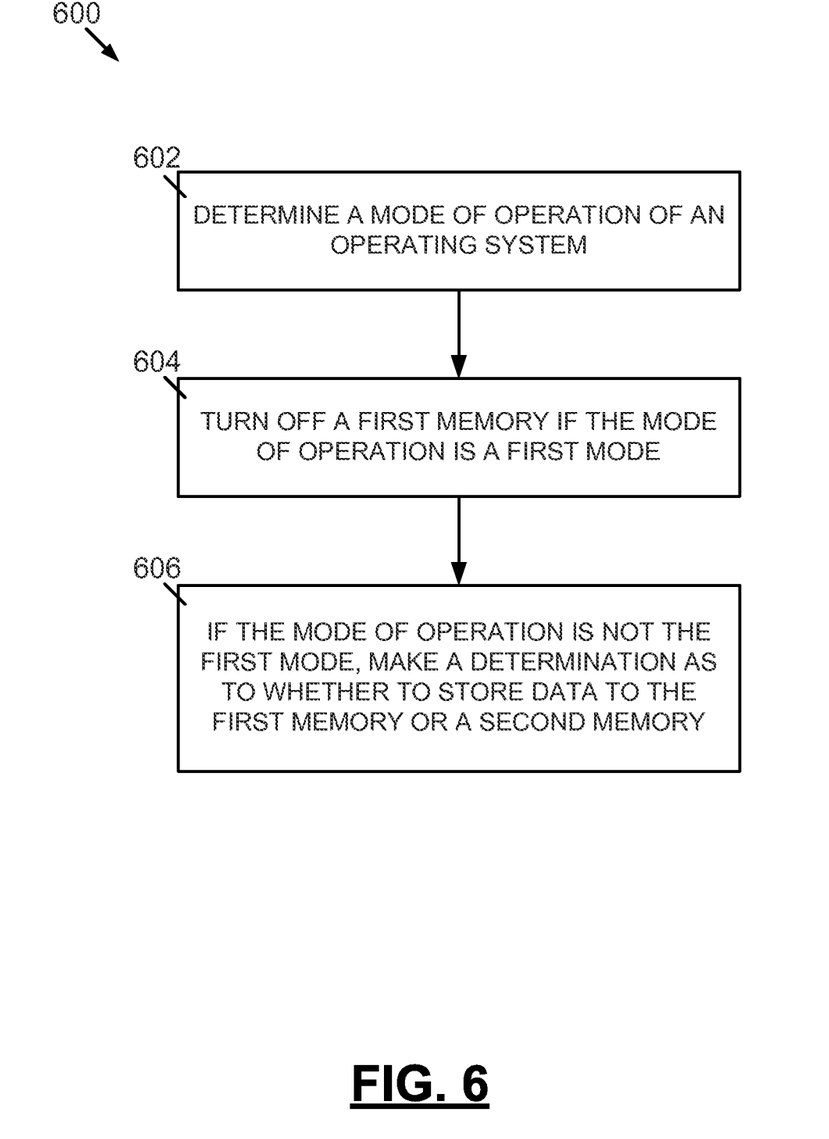
FIG. 6 is a flow diagram depicting steps of an example method for memory management in a computer system in accordance with an embodiment of the disclosure.

FIG. 6 is a flow diagram 600 depicting steps of an example method for memory management in a computer system in accordance with an embodiment of the disclosure. At 602, a mode of operation of an OS is determined. At 604, if the mode of operation is a first mode, a first memory of a first memory type is turned off. The first memory is of a different memory type than a second memory, where the second memory is of a second memory type that has a different power consumption characteristic than that of the first memory type. At 606, if the mode of operation is not the first mode, a determination is made as to whether to store data to the first memory or the second memory. The determination is based, for example, on one or more of a memory demand of a process being executed on the computer system; a type of the process, where the type of the process indicates a type of data that is manipulated by the process or a type of data that is generated by the process; whether the data is to be retained upon completion of the process; or whether the data is to be retained during the first mode of the OS. Other different suitable metrics are used in some embodiments to make this determination.

This written description depicts examples so as to enable a person skilled in the art to make and use the claimed inventions. The patentable scope includes other examples. Additionally, in various embodiments, the methods and systems described herein are implemented on many different types of processing devices by program code comprising program instructions that are executable by the device processing subsystem. The software program instructions include source code, object code, machine code, or any other stored data that is operable to cause a processing system to perform the methods and operations described herein. Other implementations are used in an embodiment, however, such as firmware or even appropriately designed hardware configured to carry out the methods and systems described herein.

This application uses examples to illustrate the invention. The patentable scope of the invention includes other examples.

What is claimed is:

1. A computer system comprising:
   an integrated circuit including:
      a first memory of a first memory type; and
      a second memory of a second memory type, wherein the first memory and the second memory consume a same or similar amount of power when operating in an active mode in which data can be retained, read and written, and wherein the second memory consumes less power than the first memory when operating in a standby mode in which data can be retained but not read or written;
      a processing unit configured to execute a process that generates a data item to be stored in at least one of two memories that comprise the first memory and the second memory; and
      a memory controller coupled to the processing unit, the memory controller including a first interface and a second interface coupled to the first memory and the second memory, respectively, wherein the second interface is separate from the first interface, and wherein the memory controller is configured to select which of the two memories to store the data item in, based at least partially on (i) a data-retention characteristic of the data item, the data-retention characteristic corresponding to whether or not the data item is to be retained upon completion of the process and whether or not the data item is to be retained during the standby mode, and (ii) whether the process is of a type that is not required to reside in the first memory or the second memory during the standby mode.

2. The computer system of claim 1, wherein the first memory is a double data rate synchronous dynamic random access memory (DDR SDRAM), and wherein the second memory is a Low Power Double Data Rate synchronous dynamic random access memory (LPDDR SDRAM) or a Mobile Double Data Rate memory.

3. The computer system of claim 1, wherein the first memory is configured to be turned off during the standby mode by not supplying power to the first memory to eliminate or lower a leakage current of the first memory.

4. The computer system of claim 1, wherein the memory controller is configured to store the data item in the first memory when a memory demand of the process is high, the high memory demand including storage of large amounts of data or a high rate at which the data is read from or stored into the first memory or the second memory.

5. The computer system of claim 1, wherein the memory controller is configured to store the data item in the first memory when the processing unit is executing instructions for a multimedia computer program, the multimedia computer program including an interactive gaming functionality or a video recording functionality.

6. The computer system of claim 1, wherein the computer system is a mobile device that consumes power from a battery.

7. The computer system of claim 1, wherein the memory controller is configured to select which of the two memories to store the data item in, at least partially in response to whether the second memory has sufficient capacity for a memory demand of a process executed by the processing unit.

8. The computer system of claim 7, wherein the memory controller is configured to select which of the two memories to store the data item in, at least partially in response to whether the data item is (i) generated by the process or (ii) manipulated by the process.

9. The computer system of claim 8, wherein the memory controller is configured to select which of the two memories to store the data item in, at least partially in response to whether a mode of operation of an operating system executed on the processing unit is (i) standby mode or (ii) active mode.

10. The computer system of claim 8, wherein the memory controller is configured to select which of the two memories to store the data item in, at least partially in response to whether the data item needs to be retained during a standby mode of the operating system executed on the processing unit.

11. The computer system of claim 1, wherein the second memory has less memory capacity than the first memory.

12. A method comprising:
accessing, by a processing unit of an integrated circuit, a first memory of a first memory type and a second memory of a second memory type, for writing data into the first memory and the second memory, wherein the first memory and the second memory consume a same or similar amount of power when operating in an active mode in which data can be retained, read and written, and wherein the second memory consumes less power than the first memory when operating in a standby mode in which data can be retained but not read or written;
executing, by the processing unit, a process that generates a data item to be stored in at least one of two memories comprising the first memory and the second memory; and
selecting, by a memory controller coupled to the processing unit and the first memory and the second memory, which of the two memories to store the data item in, based at least partially on (i) a data-retention characteristic of the data item, the data-retention characteristic corresponding to whether or not the data item is to be retained upon completion of the process, and whether or not the data item is to be retained during the standby mode, and (ii) whether the process is of a type that is not required to reside in the first memory or the second memory during the standby mode.

13. The method of claim 12, wherein the processing unit accessing of the first, memory and the second memory comprises the processing unit accessing, respectfully, (i) a double data rate synchronous dynamic random access memory (DDR SDRAM) and (ii) a Low Power Double Data Rate synchronous dynamic random access memory (LPDDR SDRAM).

14. The method of claim 12, wherein the selecting of which of the two memories to store the data item in is at least partially in response to whether the second memory has sufficient capacity for a memory demand of a process executed on by the processing unit.

15. The method of claim 14, wherein the selecting of which of the two memories to store the data item in is at least partially in response to whether the data item is (i) generated by the process or (ii) manipulated by the process.

16. The method of claim 15, wherein the selecting of which of the two memories to store the data item in is at least partially in response to whether a mode of operation of an operating system executed on the processing unit is (i) standby mode or (ii) active mode.

17. The method of claim 15, wherein the selecting of which of the two memories to store the data item in is at least partially in response to whether the data item needs to be retained during a standby mode of the operating system executed on the processing unit.

18. A computer system comprising:
an integrated circuit including:
a processing unit, and
a memory controller coupled to the processing unit, the memory controller including a first interface and a second interface configured to couple the memory controller with a first memory and a second memory, respectively, wherein the second interface is separate from the first interface;
the first memory of a first memory type coupled to the memory controller through the first interface; and
the second memory coupled to the memory controller through the second interlace, the second memory being of a second memory type;
wherein the first memory and the second memory are used exclusively for the processing unit;
wherein the second memory consumes less power than the first memory when operating in a standby mode, the standby mode being a low power mode in which data values are held and the second memory is prohibited from reading and writing data;
wherein the first memory and the second memory consume a same or similar amount of power when operating in an active mode, the active mode for reading, writing, and holding data values; and
wherein the integrated circuit determines whether to store data to the first memory or the second memory based on:
a memory-demand characteristic of a process executed on the processing unit, the memory-demand characteristic corresponding to an amount of memory required by the process,
a type of the process, wherein the type of the process indicates a type of data that is manipulated by the process or a type of data that is generated by the process,
a mode of operation of an operating system being executed on the processing unit, the modes of operation of the operating system including the standby mode and the active mode,
whether the process is of a type that is not required to reside in the first memory or the second memory during the standby mode,
a data-retention characteristic of the data, the data-retention characteristic corresponding to whether the data is to be retained upon completion of the process, and
whether the data is to be retained during the standby mode.

* * * * *